United States Patent [19]

Omura et al.

[11] Patent Number: 5,889,682
[45] Date of Patent: Mar. 30, 1999

[54] CLOCK ROUTING DESIGN METHOD USING A HIERAICHICAL LAYOUT DESIGN

[75] Inventors: Masayuki Omura, Kahoku-gun; Noriyuki Ito, Kawasaki, both of Japan

[73] Assignee: Fujitsu Limited, Kawasaki, Japan

[21] Appl. No.: 951,480

[22] Filed: Oct. 16, 1997

Related U.S. Application Data

[63] Continuation of Ser. No. 444,515, May 19, 1995, abandoned.

[30] Foreign Application Priority Data

Sep. 9, 1994 [JP] Japan .................. 6-216384

[51] Int. Cl.⁶ .................................. G06F 15/60
[52] U.S. Cl. .................. 364/491; 364/489; 364/490; 364/488
[58] Field of Search .................. 364/488, 489, 364/490, 491; 385/14; 307/269, 603

[56] References Cited

U.S. PATENT DOCUMENTS

| | | |
|---|---|---|
| 5,309,035 | 5/1994 | Watson, Jr. et al. ............ 307/269 |
| 5,339,253 | 8/1994 | Carrig et al. ............ 364/489 |
| 5,410,491 | 4/1995 | Minami ............ 364/491 |
| 5,416,861 | 5/1995 | Koh et al. ............ 385/14 |
| 5,583,788 | 12/1996 | Kuribayashi ............ 364/490 |

*Primary Examiner*—Kevin J. Teska
*Assistant Examiner*—Matthew Loppnow
*Attorney, Agent, or Firm*—Staas & Halsey

[57] ABSTRACT

A clock routing design method enables a routing design for each hierarchy while paying an attention to each layout hierarchy to which a branch of a clock signal system extends and considering a whole chip. In the clock routing design method, a clock signal line is routed between a plurality of receiver terminals over a plurality of layout hierarchies while considering an equal-delay branch point yielding equal delays of a clock signal at the receiver terminals, the clock signal line is then routed between the equal-delay branch point positioning between the plural receiver terminals and the driver terminal. The clock routing design method is applicable to a layout design of wire patterns, cell, etc. on LSIs, printed circuit boards and the like.

14 Claims, 16 Drawing Sheets

| TERMINAL | LAYOUT HIERARCHY INCLUDING THE TERMINAL |
|---|---|
| DV 1 | Layout 1 |
| RV 1 | Layout 2 |
| RV 2 | Layout 4 |
| RV 3 | Layout 5 |
| RV 4 | Layout 3 |

FIG. 25

| TERMINAL | LAYOUT HIERARCHY INCLUDING THE TERMINAL |
|---|---|
| DV 1 | Layout 1 |
| RV 1 | Layout 2 |
| RV 2 | Layout 4 |
| RV 3 | Layout 5 |
| RV 4 | Layout 3 |

FIG. 26

| LAYOUT HIERARCHY | CONDITION OF CELL PLACEMENT |
|---|---|
| Layout 1 | PLACEMENT COMPLETED |
| Layout 2 | PLACEMENT INCOMPLETED |
| Layout 3 | PLACEMENT COMPLETED |
| Layout 4 | PLACEMENT COMPLETED |
| Layout 5 | PLACEMENT INCOMPLETED |

FIG. 27

| TERMINAL PAIR | SELECTION | REASON |
|---|---|---|
| RV1 - RV2 | ○ | PLACEMENT OF A CELL INCLUDING RV2 IS DETERMINED |
| RV3 - RV4 | ○ | PLACEMENT OF A CELL INCLUDING RV4 IS DETERMINED |
| ED1 - ED2 | X | CONNECTIONS BETWEEN RV1-RV2 AND RV3-RV4 ARE INCOMPLETED |
| DV1 - ED3 | X | CONNECTION BETWEEN ED1-ED2 IS INCOMPLETED | ns to dispose the
5,889,682

1

CLOCK ROUTING DESIGN METHOD USING A HIERAICHICAL LAYOUT DESIGN

This application is a continuation of application Ser. No. 08/444,515, filed May 19, 1995, now abandoned.

BACKGROUND OF THE INVENTION

1) Field of the Invention

The present invention relates to a method and apparatus used in a layout design for a routing pattern, a cell and the like on an LSI or a printed circuit board. More specifically, the present invention relates to a clock routing design method for designing a routing of clock signal lines using a hierarchical layout design.

2) Description of the Related Art

In an layout design for an LSI or a printed circuit board, it is, in general, desirable that clock signal lines routed between one driver terminal providing a clock signal and a plurality of receiver terminals receiving the clock signal are so routed that the clock signal supplied from the driver terminal reaches each of the receiver terminals substantially at the same time (exactly at the same time, ideally). A variation in a time period required until the clock signal reaches each of the receiver terminals from the driver terminal is referred as clock skew.

In recent years, there is an increasing demand for a zero skew routing of a clock signal, in other words, a routing which can provide the clock skew at zero with an increase in clock frequency in LSIs or the like. With an increase of a degree of integration of LSIs or the like, there is also an increase of demand for shortening a time period required for the layout design. To meet these two demands, it is necessary to shorten a time period required for the layout design besides realizing a minimum skew of the clock signal lines in the hierarchical layout design.

In the hierarchical layout design method, an area that is an object of the routing design on a chip is divided into a plurality of layout hierarchies. The routing inside each of the hierarchies is designed, thereafter the routing between the layout hierarchies is performed to complete the routing design overall the chip. If a degree of integration of LSIs is increased, such hierarchical layout design method allows a large decrease in a time period required for layout design as compared with a method in which the routing design of the overall chip is performed at the same time.

Now referring to FIGS. 28 through 31, a procedure of a general routing design for clock signals employing the hierarchical layout design will be described.

In FIGS. 28 through 31, an area enclosed by a thick line "Layout 0" designates an area of a chip level (the whole of a chip that is an object of the routing), and areas enclosed by thin lines "Layout 1" through "Layout 5" designate the layout hierarchies divided and set, respectively, inside the area "Layout 0" on the chip. Here is shown an example where five layout hierarchies are set.

In FIGS. 28 through 31, "●" designates a driver terminal DV1 providing a clock signal, "○" designates receiver terminals RV1 through RV4 receiving the clock signal supplied from the driver terminal DV1, and "⊙" designates clock supplying terminals M0 through M4 set on boundaries of the respective layout hierarchies "Layout 1" through "Layout 5".

FIGS. 28 through 31 show an example where one driver terminal DV1 is disposed within the layout hierarchy "Layout 1" and the receiver terminals RV1, RV4, RV2 and RV3

2 are disposed in the layout hierarchies "Layout 2" through "Layout 5", respectively.

As shown in FIG. 28, the whole area "Layout 0" on the chip is divided into, for example, five areas "Layout 1" through "Layout 5" so as to hierarchize the whole chip. Thereafter, as shown in FIG. 29, positions to dispose the clock supplying terminals M0 through M4 therein are decided on boundaries of the respective layout hierarchies "Layout 1" through "Layout 5".

One clock supplying terminal is set to one layout hierarchy. In the example shown in FIG. 29, the clock supplying terminal M0 used to output the clock signal supplied from the driver terminal DV1 outside the layout hierarchy "Layout 1" is set on the boundary of the layout hierarchy "Layout 1", while the clock supplying terminals M1, M4, M2 and M3 used to supply the clock signal to the receiver terminals RV1, RV4, RV2 and RV3, respectively, are set on the boundaries of the respective layout hierarchies "Layout 2" through "Layout 5".

As shown in FIG. 30, at first, a process to route the clock signal line inside each of the layout hierarchies "Layout 1" through "Layout 5" is performed, in other words, routing designs between the driver terminal DV1 and the clock supplying terminal M0, and between the receiver terminals RV1 through RV4 and the respective clock supplying terminals M1 through M4, are worked out. After that, a routing design for mutually connecting the clock supplying terminals M0 through M4 set on the boundaries of the respective layout hierarchies "Layout 1" through "Layout 5" is performed finally, as shown in FIG. 31.

As stated above, electrical connection among the layout hierarchies is performed after completion of the routing design in each of the layout hierarchies in the general clock routing design method using the above-stated hierarchical layout design. Therefore, it has certain disadvantages as follows:

(1) when a routing design inside each of the layout hierarchies is performed, it is impossible to consider the state of the routing design within another layout hierarchies;

(2) well-balanced routing among the layout hierarchies is unavailable;

(3) it is impossible to perform the clock routing taking a consideration of the whole chip.

In consequence, use of the hierarchy layout design may not only permit a shorter time for the layout design but also impose a less freedom of the routing design. To minimize the clock skew to realize the zero skew routing, it is necessary to repeat the routing design in a trial-and-error fashion, resulting in an increase in the time for the layout design.

In practically proceeding the layout design for LSIs or the like, there are some cases where the layout design of only a part of layout hierarchies goes ahead. In which case, it may happen that the routing process on the clock signal lines is required even if the routing design of all the layout hierarchies is not completed. In the above-mentioned procedure of the general clock routing design, if placement of all layout hierarchies and placement of cells within each of the layout hierarchies are not completed, it is impossible to design the routing of a signal system of, for example, a clock signal branching and extending to each of the hierarchies.

SUMMARY OF THE INVENTION

To overcome the above problems, this invention provides a clock routing design method using a hierarchical layout design enabling a routing design of each layout hierarchy while paying an attention to each of the layout hierarchy to which a branch of a clock system extends and considering a whole area that is an object of the routing design if the clock signal system branches and extends to a plurality of layout hierarchies so as to provide a minimum clock skew and realize a decrease in time period required for the routing design.

According to this invention, a clock routing design method for making a routing design of clock signal lines between a driver terminal supplying a clock signal and a plurality of receiver terminals receiving the clock signal from the driver terminal using a hierarchical layout design in which an area that is an object of the routing design is divided into a plurality of layout hierarchies, comprising the steps of routing the clock signal line between said plural receiver terminals over said plural layout hierarchies while considering an equal-delay branch point yielding equal delays of the clock signal at said receiver terminals, and routing the clock signal line between the equal-delay branch point positioning between said plural receiver terminals and said driver terminal.

As above, the clock routing design method using a hierarchical layout design according to this invention enables a routing design of each layout hierarchy while paying an attention to each of the layout hierarchies and considering, at the same time, a whole area that is an object of the routing design, even if a clock signal system branches and extends to a plurality of layout hierarchies so that the clock skew may be minimized and a time period required for the routing design may be shortened.

DESCRIPTION OF THE DRAWINGS

FIG. 25 is a table showing a relation between each terminal and a layout hierarchy to which the terminal belongs according to this embodiment;

FIG. 26 is a table showing a relation between each layout hierarchy and a condition of cell placement according to this embodiment;

FIG. 27 is a table showing reasons to select or not select an assumptive terminal pair according to this embodiment;

DESCRIPTION OF THE PREFERRED EMBODIMENTS (a) Description of An Aspect of the Invention FIG. 1 is a flowchart illustrating an aspect of this invention.

Figure 1:
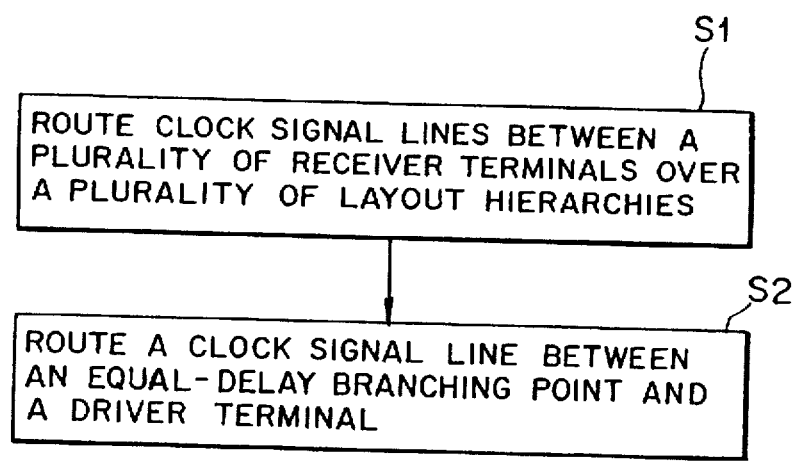
FIG. 1 is an illustration showing an aspect of this invention.

A clock routing design method using a hierarchy layout design according to this invention is to route clock signal design lines between a driver terminal supplying a clock signal and a plurality of receiver terminals receiving the clock signal when a routing design is made by dividing an area that is an object of the routing design into a plurality layout hierarchies. The clock routing design method according to this invention is performed by taking two steps S1 and S2 shown in FIG. 1.

More specifically, at Step S1, clock signal lines are routed between a plurality of receiver terminals over a plurality of layout hierarchies while considering an equal-delay branch point yielding equal delays of a clock signal at the receiver terminals. At Step S2, a clock signal line is routed between the equal-delay branch point positioning between the plural receiver terminals and the driver terminal.

In a process at Step S1, there is performed a receiver terminal pair forming process to divide the plural receiver terminals into pairs. After that, a receiver terminal interconnecting process to route the clock signal line between the receiver terminals of each pair, and an equal-delay branch point searching process to search an equal-delay branch point yielding equal delays of the clock signal at the both receiver terminals of the pair on the clock signal line between the receiver terminals of said pair are performed.

If it is found in the equal-delay branch point searching process that a plurality of equal-delay branch points exist, an equal-delay branch point pair forming process is performed to divide the plural equal-delay branch point into pairs. Then, an equal-delay branch point interconnecting process is performed to route the clock signal line between the equal-delay branch points of each pair, and an equal-delay branch point searching process is performed to search an equal-delay branch point on the clock signal line between the equal-delay branch points of each pair. Thereafter, the equal-delay branch pair forming process, the equal-delay branch point interconnecting process and the equal-delay branch point re-searching process are repeated until the number of the equal-delay branch point becomes at least one.

In the above receiver terminal interconnecting step, a routing path between layout hierarchies having the shortest length and a minimum number of crossing over boundaries of the layout hierarchies is selected between the receiver terminals of each pair. Layout hierarchy connecting terminals are disposed in optimum positions on the boundaries of the layout hierarchies, respectively, through which the path between the layout hierarchies passes. The clock signal line is then routed at the shortest length between the the receiver terminals of the pair via the layout hierarchy connecting terminals. In the equal-delay branch point searching process, an equal-delay branch point is searched on the clock signal line between the receiver terminals of the pair obtained by the above shortest length routing.

The clock signal line between the receiver terminals of the pair is routed at a specified wire length within a layout hierarchy including the equal-delay branch point while keeping a position of the equal-delay branch point. If the specified length routing is impossible within the layout hierarchy including the equal-delay branch point, the clock signal line in another layout hierarchy may be an object of the specified routing.

In the above-mentioned equal delay branching interconnecting process, a path between layout hierarchies having the shortest length and a minimum number of crossing over boundaries of layout hierarchies is selected between the equal-delay branch points of each pair, as same as in the receiver terminal interconnecting process. Layout hierarchy connecting terminals are disposed in respective optimum positions on the boundaries of the layout hierarchies through which the path between layout hierarchies passes. After that, the clock signal line passing through the layout hierarchy connecting terminal and connecting the equal-delay branch points of the pair is routed at the shortest length. In the equal-delay branch point re-searching process, an equal-delay branch point is searched on the clock signal line between the equal-delay branch points of the pair obtained by the above shortest length routing.

At this time, the clock signal line is routed between the equal-delay branch points of the pair at a specified wire length within a layout hierarchy including the equal-delay branch point while keeping a position of the equal-delay branch point. If the specified length routing is impossible within the layout hierarchy including the equal-delay branch point, the clock signal line in another layout hierarchy may be an object of the specified length routing.

If the number of pairs of the equal-delay branch points which have not been routed to each other becomes one, a path between layout hierarchies having the shortest length and a minimum number of crossings over boundaries of layout hierarchies is selected between the driver terminal and each of the equal-delay branch points of that pair. Layout hierarchy connecting terminals are disposed in respective appropriate positions on the boundaries of the layout hierarchies through which the paths between the layout hierarchies pass. A specified wire length is allocated the clock signal line passing through the layout hierarchy connecting terminals and connecting the driver terminal and each of the equal delay branching terminals of that pair so that equal delays of the clock signal supplied from the driver terminal may be yielded at the equal-delay branching points and the routed path may have a predetermined wire length. Based on the specified wire length allocated, the clock signal line is routed in the specified length routing in each of the layout hierarchies.

If the number of the equal-delay branch points becomes one, a path between layout hierarchies having the shortest length and a minimum number of crossings over boundaries of layout hierarchies is selected between the driver terminal and that equal-delay branch point. Layout hierarchy connecting terminals are disposed in respective appropriate positions on the boundaries of the layout hierarchies through which the path between layout hierarchies passes. A specified wire length is allocated to the clock signal line passing through the layout hierarchy connecting terminals and connecting the driver terminal and the equal delay branch point in each of the layout hierarchies so that the clock signal line may have a predetermined wire length. Based on the specified wire length allocated, the clock signal line is routed in the specified length routing in each of the layout hierarchies.

If there is any terminal among the driver terminal and the receiver terminals belonging to the area that is an object of the routing design whose cell has not been placed within a predetermined layout hierarchy, it is assumed that the cell is placed in the center of the layout hierarchy to which that cell belongs to perform the routing design of the clock signal line.

In the above-mentioned clock routing design method using a hierarchy layout design according to this invention, clock signal lines are routed between a plurality of receiver terminals over a plurality of layout hierarchies in the process at Step S1. In the process at Step S2, the clock signal line is routed between an equal-delay branch point positioning between the plural receiver terminals and the driver terminal. Accordingly, if the clock signal system branches and extends to a plurality of the layout hierarchies, it is possible to make a routing design for each of the layout hierarchy while paying an attention to each of the layout hierarchy and considering the over all area that is an object of the routing design.

In the process at Step S1, the receiver terminals interconnecting step and the equal-delay branch point searching step are performed on each of the receiver terminals, which have been divided in pairs in the receiver terminal pair forming process. This permits an easy routing design between the receiver terminals of each pair and an easy search for an equal-delay branch point between the receiver terminals of each pair.

If a plurality of equal-delay branch points exist, the equal-delay branch points are divided into pairs in the equal-delay branch point pair forming process. The equal-delay branch point interconnecting process and the equal-delay branch point re-searching process are performed on each pair of the equal-delay branch points formed in the equal-delay branch point pair forming process. This permits an easy routing design between each pair of the equal-delay branch points and an easy search for an equal-delay branch point between the equal-delay branch points of each pair. By repeating these processes, it is possible to readily limit the number of the equal-delay branch points between a plurality of receiver terminals to at least one.

In the above receiver terminal interconnecting process and the equal-delay branch point interconnecting process, there are selected an optimum path between layout hierarchies and optimum layout hierarchy connecting terminals between the receiver terminals of each pair or between the equal-delay branch points of each pair to route them at the shortest length, an equal-delay branch point is searched on the clock signal line obtained in the above shortest length routing, the obtained equal-delay branch point is connected to the driver terminal, whereby clock skew at the plural receiver terminals may be minimized.

At this time, a specified length routing is performed by routing the clock signal line routed at the shortest wire length so as to provide a predetermined wire length to the clock signal line within the layout hierarchy including the equal-delay branch point while keeping a position of the equal-delay branch point. But if the specified length routing is impossible within the layout hierarchy including the equal-delay branch point, the designated length routing is performed on the clock signal line in another layout hierarchy.

If the number of pairs of the equal-delay branch points becomes one, an optimum path between layout hierarchies and optimal layout hierarchy connecting terminals are selected between the driver terminal and each of the equal-delay branch point. The clock signal lines connecting the driver terminal and each of the equal-delay branch point via the layout hierarchy connecting terminals are so routed as to have a predetermined wire length assuming the driver terminal as an equal-delay branch point. As a result, clock skew at the plural receiver terminals may be minimized.

If the number of the equal-delay branch points becomes one, an optimum path between layout hierarchies and optimum layout hierarchy connecting terminals are selected between the driver terminal and the equal-delay branch point. The clock signal line connecting the driver terminal and the equal-delay branch point via the layout hierarchy connecting terminals is so routed as to have a predetermined wire length. As a result, clock skew at the plural receiver terminals may be minimized.

If there is any terminal among the driver terminal and the receiver terminals which has not been placed within a predetermined layout hierarchy, it is assumed that a cell of that terminal is placed in the center of the predetermined layout to make a routing design of the clock signal. If placement of cell in all layout hierarchies is not completed, it is possible to route in advance the clock signal line in layout hierarchies in which the placement of cell is determined.

As stated above, according to the clock routing design method using a hierarchy layout design according to this invention, it is possible to make a routing design for each layout hierarchy while paying an attention to each layout hierarchy and considering an overall area that is an object of the routing design even if the clock signal system branches and extends to a plurality of layout hierarchies. The clock routing design method according to this invention may realize a minimum clock skew and a decrease in time period required for the routing design.

The receiver terminals are divided into pairs, and the receiver terminal interconnecting process, the equal-delay branch point interconnecting process, the equal-delay branch point searching process and the equal-delay branch point re-searching process are then performed so that a routing design for each pair and a search for an equal-delay branch point may be easily made and a time period required for the routing design may be shortened.

An optimum path between layout hierarchies and optimum layout hierarchy connecting terminals are selected to route each of the pairs in the shortest length, and the equal-delay branch point searched on the clock signal line routed in the shortest length routing is connected to the driver terminal so that clock skew may be minimized to realize zero-skew routing for the clock signal.

It is possible to minimize the clock skew and perform a specified length routing at the same time by routing the clock signal line at a predetermined wire length within a layout hierarchy including an equal-delay branch point while maintaining a position of the equal-delay branch point. If the specified length routing is impossible within only the layout hierarchy including the equal-delay branch point, it is possible to perform the specified length routing on the clock signal line in another layout hierarchy so as to minimize the clock skew and perform the designated length routing for certain.

If the number of pairs of the equal-delay branch points becomes one or the number of the equal-delay branch point becomes one, an optimum path between layout hierarchies and optimum layout hierarchy connecting terminals are selected between the driver terminal and the equal-delay branch point to route the clock signal line so that the driver terminal and the equal-delay branch point may be routed at a minimum clock skew to realize zero-skew routing for the clock signal.

If there exists any terminal among the driver terminal and the receiver terminals which has not been placed within a layout hierarchy, a cell having that terminal is assumptively placed in the center of the layout hierarchy to make a routing design of the clock signal line. As a result, it is possible to perform the routing process to route the clock signal line in advance in layout hierarchies in which placement of the cell is determined even if placement of the cell is not yet determined in all the layout hierarchies so that the clock routing may be performed effectively.

(b) Description of Embodiment

Hereinafter, an embodiment of this invention will be described by reference to accompanying drawings.

Figure 2:
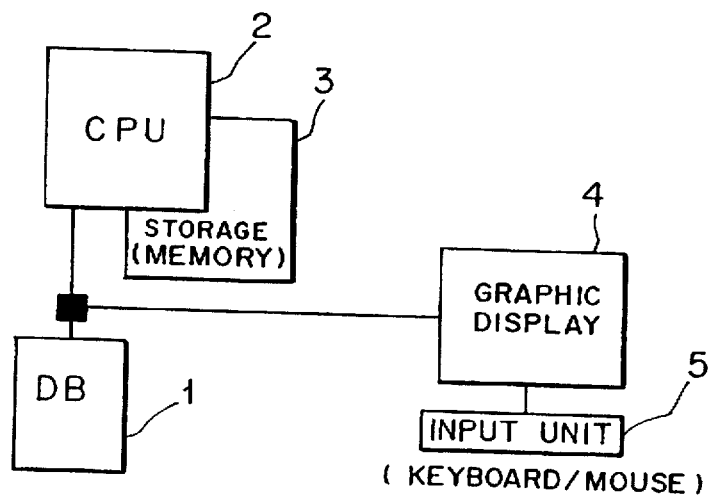
FIG. 2 is a block diagram showing a structure of workstation applied a method according to an embodiment of this invention thereto.

FIG. 2 is a block diagram of a workstation applied a method of this invention thereto. A method of a clock routing design according to this embodiment is implemented in a worstation, with a structure as shown in FIG. 2, including a software enabling a hierarchical layout design. In FIG. 2, reference numeral 1 designates a database (DB), 2 designates a central processing unit (CPU), 3 designates a storage (memory), 4 designates a graphic display, and 5 designates an input unit such as a keyboard, a mouse, etc.

The database 1 serves to store design data (cells, cell placement information, information of layout hierarchical areas, etc.) about a chip such as a LSI or the like which is an object of the routing design. The central processing unit 2 operates according to a program for a hierarchical layout design stored in the storage 3 to design a routing of an area that is an object of the routing design in the hierarchical layout design on the basis of the design data fed from the database 1.

The storage 3 stores not only the program for the hierarchical layout design as stated above, but also various tables and the like required for a clock routing design, which will be described later by reference to FIG. 15 and FIGS. 25 through 27. The graphic display 4 sequentially displays thereon a situation of the routing design in the area that is an object of the routing design as shown, for example, in FIGS. 10 through 14, or FIGS. 16 through 24. The input unit 5 serves to suitably input data necessary for the routing design.

With the work station as shown in FIG. 2, the routing design for clock signal lines in the hierarchical layout design is worked out as will be hereinafter described by reference to FIGS. 3 through 24.

A method for a clock routing design according to this embodiment is to, focusing on a certain clock signal system, make a routing design of clock signal lines passing between layout hierarchies so as to equalize delays of a clock signal distributed from one driver terminal to a plurality of receiver terminals in that clock signal system. In consequence, by designing routing of all clock signal systems in this method, it is possible to accomplish minimization of the clock skew (zero-skew routing) on the whole of an object of the routing design such as an LSI or the like.

Figure 3:
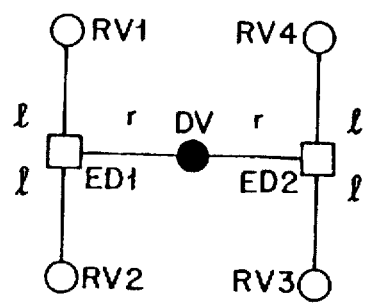
FIG. 3 is an illustration showing a first routing model according to the embodiment of this invention.
Figure 4:
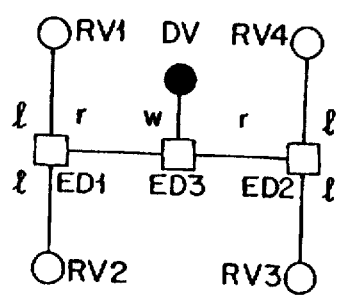
FIG. 4 is an illustration showing a second routing model according to the embodiment of this invention.

Ahead of the routing design according to the clock routing design method of this embodiment, there are set two routing design models shown in FIGS. 3 and 4, respectively. FIGS. 3 and 4 show examples of models, respectively, where one driver terminal and four receiver terminals are provided. This invention is, however, not limited to these examples.

In FIGS. 3 and 4, "●" designates a driver terminal DV supplies a clock signal, "·" designates receiver terminals RV1–RV4 receiving the clock signal supplied from the driver terminal DV, "☐" designates equal-delay branch points ED1–ED3, and 1, r and w designate specified wire lengths, respectively.

ED1 is an equal-delay branch point on a clock signal line between the receiver terminals RV1 and RV2, ED2 is an equal-delay branch point on a clock signal line between the receiver terminals RV3 and RV4, and ED3 is an equal-delay branch point on a clock signal line between the equal-delay branch points ED1 and ED2.

In a first routing model shown in FIG. 3, a path between the receiver terminal RV1 and RV2 and a path between the receiver terminal RV3 and RV4 are routed in the first place, the equal-delay branch point ED1 on a routed path between the receiver terminals RV1 and RV2 and the equal-delay branch point ED2 on a routed path between the receiver terminals RV3 and RV4 are searched in the second place, and a path between the driver terminal DV and the equal-delay branch point ED1, and a path between the driver terminals DV and ED2 are routed in the third place. Here, lengths between the RV1 and ED1, the RV2 and ED1, the RV3 and ED2, the RV4 and ED2, the DV and the ED1, and the DV and the ED2 are, in advance, specified to 1 or r, as shown in FIG. 3.

In a second routing model shown in FIG. 4, a path between the receiver terminals RV1 and RV2 is routed besides a path between the receiver terminals RV3 and RV4 is routed, the equal-delay branch point ED1 on a routed path between the receiver terminals RV1 and RV2 and the equal-delay branch point ED2 on a routed path between the receiver terminals RV3 and RV3 are searched, a path between the equal terminals ED1 and ED2 is thereafter routed, the equal-delay branch point ED3 on a routed path between these equal-delay branch points ED1 and ED2 is then searched, and path having a specified wire length w is routed between the equal-delay branch point ED3 and the driver terminal DV.

Incidentally, the first routing model shown in FIG. 3 can be considered as a model where the specified wire length w is specified to 0 in the second routing model shown in FIG. 4, in other words, a position of the driver terminal DV coincides with a position of the equal-delay branch point ED3.

The next description will be of a procedure of a process for the clock routing design according to this embodiment after completion of the placement of layout hierarchies and placement of cells in the layout hierarchies by reference to flowcharts shown in FIGS. 5 through 8.

Figure 5:
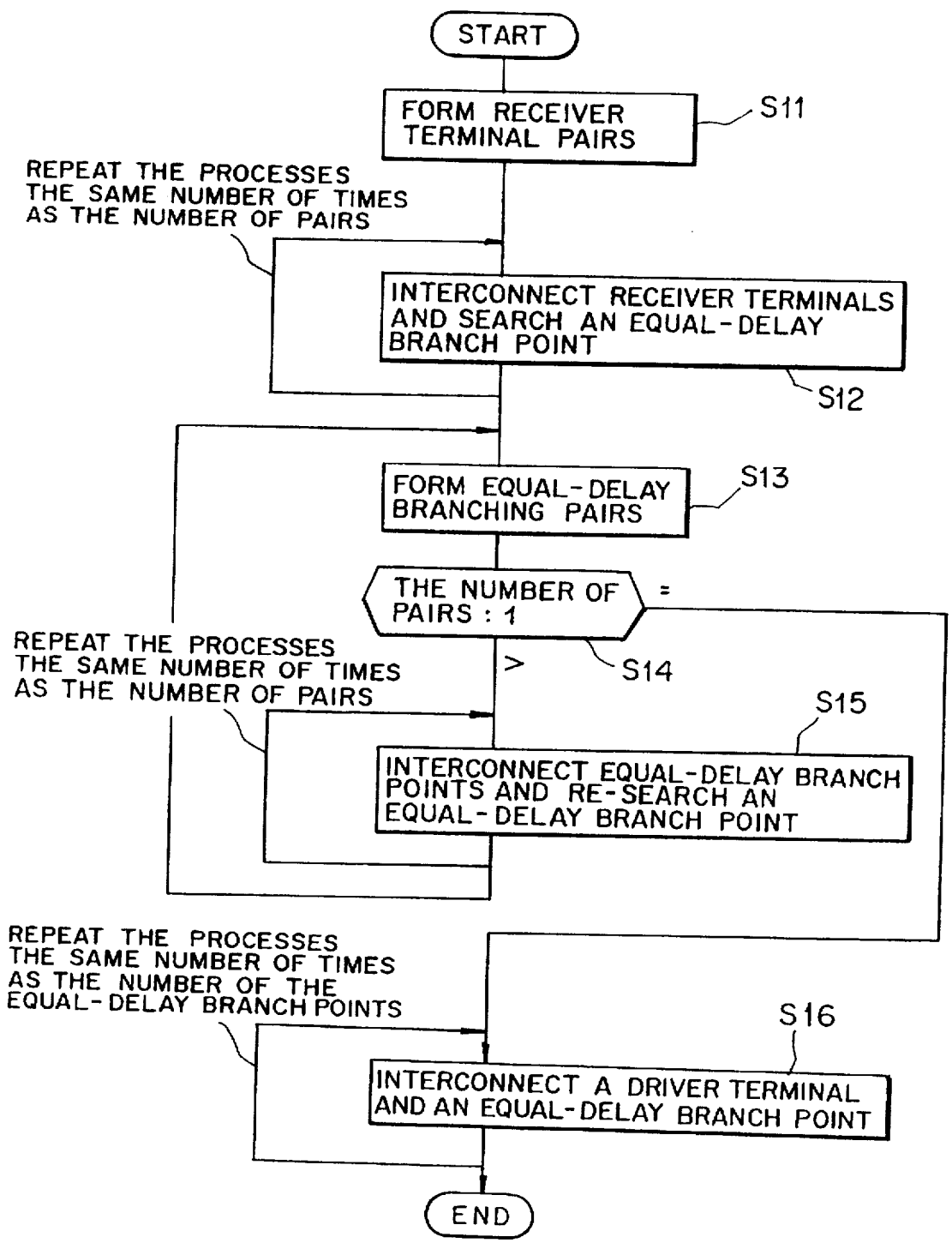
FIG. 5 is a flowchart for illustrating a procedure of a clock routing design process performed on the first routing model according to the embodiment.

Referring first to FIG. 5, an outline of the procedure of the process for the clock routing design according to this embodiment for the first routing model shown in FIG. 3 will be now described.

A plurality of receiver terminals in a focused clock signal system are divided into pairs (Step S11). A clock signal line is routed and connected between each pair of two receiver terminals, and an equal-delay branch point which can yield equal delays of a clock signal at the two receiver terminals at the both ends of that clock signal line (Step S12). The process at Step 12 is repeated the same number of times as the number of pairs formed at Step S11 according to a flowchart shown in FIG. 7, which process will be described later.

The equal-delay branch points having been searched at Step S12 are divided into pairs in the same manner as at Step S11 (Step S13). A decision is made on whether the number of pairs of the equal-delay branch points exceeds one or not (Step S14).

If the number of pairs of the equal-delay branch points exceeds one, a clock signal line is routed and connected between the equal-delay branch points of each pair, and an equal-delay branch point which can yield equal delays of a clock signal at the two equal-delay branch points at both ends of that clock signal line is searched in the same manner as at Step S12 (Step S15). The process performed at Step S15 is repeated the same number of times as the number of the pairs formed at Step S13 according to the flowchart in FIG. 7, which process will be described later.

When the process at Step S15 is completed, pairs of the equal-delay branch points are formed once more at Step S13. The decision on the number of the pairs is performed at Step S14. The process at Steps S13 through S15 is repeated until the number of the pairs of the equal-delay branch points is decided to be one at Step 14.

If the number of the pairs of the equal-delay branch points is decided to be one at Step S14, the driver terminal is connected to each of the equal-delay branch points of the remaining pair (Step S16). Then, the process of the clock routing design is terminated. The process at Step S16 is repeated in the same number of times as the number of the remaining equal-delay branch points (here 2) according to a flowchart shown in FIG. 8, which process will be described later.

Figure 6:
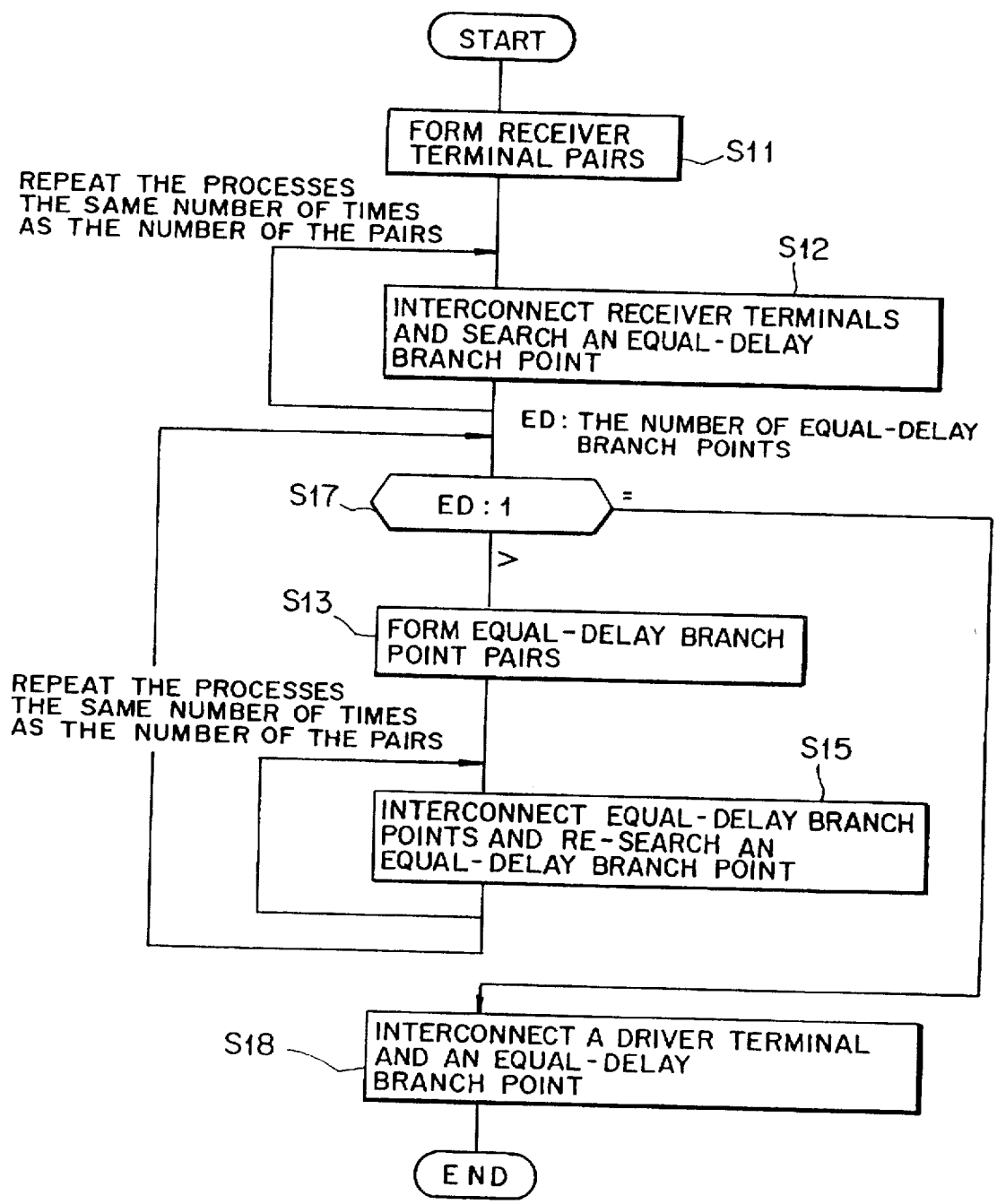
FIG. 6 is a flowchart for illustrating a procedure of a clock routing design process performed on the second routing model according to the embodiment.

Referring now to FIG. 6, an outline of a procedure of a process for the clock routing design according to the embodiment for the second model shown in FIG. 4 will be next described. In FIG. 6, steps at which quite the same procedure are taken are designated by the same step numbers in FIG. 5.

As shown in FIG. 6, in the case of the second routing model, as same as in the first routing model, pairs of the receiver terminals are formed and processed at Step S11. At step S12, the receiver terminal interconnecting process and the equal-delay branch point searching process are performed. The processes at Step S12 are repeated the same number of times as the number of the pairs having been formed at Step S11 according to the flowchart shown in FIG. 7, which will be described later.

After that, in the case of the second routing model, a decision is made on whether the number of the equal-delay branch points exceeds one or not (Step S17).

If the number of the equal-delay branch points exceeds one, the process to form pairs of the equal-delay branch points is performed in Step S13, then equal-delay branch point interconnecting process and the equal-delay branch point re-searching process are performed at Step S15, as same as in the first routing model. The process at Step S15 is here repeated the same number of times as the number of pairs formed at Step S13 according to a flowchart, which will be described later by reference to FIG. 7.

When the process at Step S15 is completed, a decision is again made on the number of the equal-delay branch points at Step S17. The processes at Steps S17, S13 and S15 are repeated until the number of the equal-delay branch points is decided to be one at Step S17.

If the number of equal-delay branch points is decided to be one at Step S14, the driver terminal is connected to the remaining one equal-delay branch point (Step S18). The process at Step S18 is performed basically according to a flowchart shown FIG. 8 which will be described later.

Figure 7:
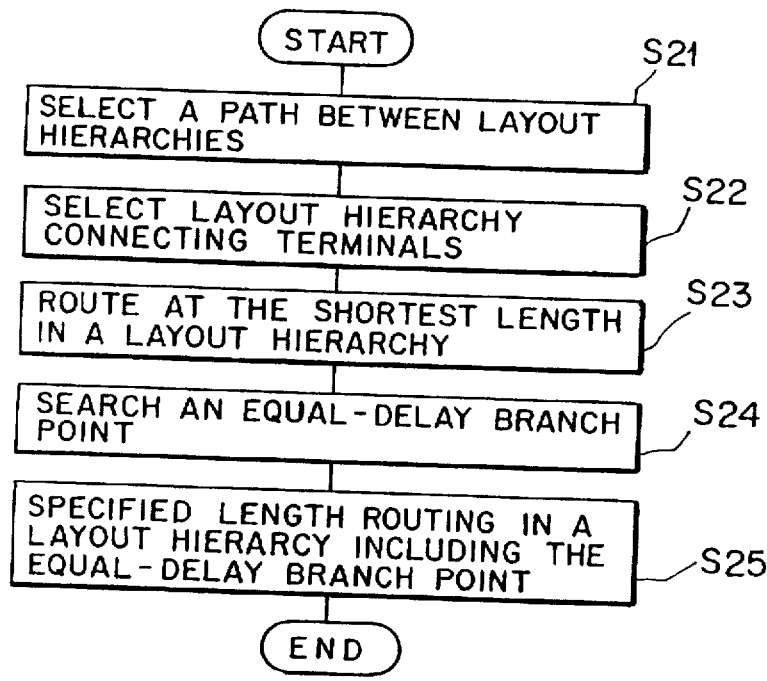
FIG. 7 is a flowchart illustrating a procedure of a receiver terminal interconnecting process or an equal-delay branch point interconnecting process and an equal-delay branch point searching process according to this embodiment.

A procedure of the processes performed at Steps S12 and S15 shown in FIGS. 5 and 6, respectively, will be next described referring to FIG. 7. There are performed the receiver terminal interconnecting process or the equal-delay branch point interconnecting process and the equal-delay branch point searching process.

To begin with, there is selected a path between layout hierarchies having the shortest length and a minimum number of crossings over boundaries of layout hierarchies extending from a start point (either one of a pair of the receiver terminals or either one of a pair of the equal-delay branch points) within a designated layout hierarchy to an end point (the other one of the pair of the receiver terminals or the other one of a pair of the equal-delay branch points) (Step S21).

The layout hierarchy connecting terminals are disposed on the boundaries of the layout hierarchies over which the path between layout hierarchies crosses. At that time, the layout hierarchy connecting terminals should be disposed by selecting their optimum positions, considering superimposition of a layout hierarchy connecting terminal belonging to another signal system, obstacles in the vicinity of the positions of the layout hierarchy connecting terminals, etc. (Step S22).

Thereafter, the clock signal lines connecting the start point and the layout hierarchy connecting terminal, the layout hierarchy connecting terminal and another layout hierarchy connecting terminal, and the end point and the layout hierarchy connecting terminal, are routed at the shortest lengths, respectively, within the layout hierarchies through which the path between layout hierarchies passes (Step S23).

At the time of such the shortest length routing, a point on the routed path between the start point within the designated layout hierarchy and the end point which can yield equal delays from the start point to the end point (delays of the clock signal) is searched, and the obtained point on the routed path is entered as an equal-delay branch point (Step S24). A position of the equal-delay branch point does not necessarily lie on a middle point of a wire length between the start point and the end point. The position of the equal-delay branch point is, in general, off the middle point due to electrical effects of an electric current flowing through a wire running in the vicinity, a wire crossing in another layer, a power source, etc.

After the search of the equal-delay branch point at Step 24, the clock signal line between the start point and the equal-delay branch point and the clock signal line between the end point and the equal-delay branch point are so routed as to have an equal delay and a predetermined wire length within the layout hierarchy including the equal-delay branch point in a specified length routing (Step S25). In other words, the specified length routing is performed while a position of the equal-delay branch point is kept within the layout hierarchy including that equal-delay branch point. If the delay cannot be adjusted within the layout hierarchy including the equal-delay branch point, another layout hierarchy can be an object of this specified length routing.

Figure 8:
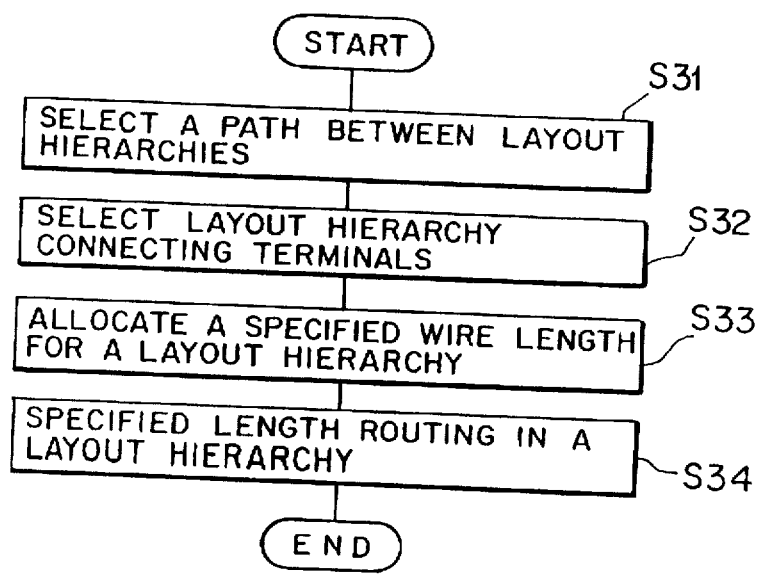
FIG. 8 is a flowchart illustrating a procedure of a process for interconnecting a driver terminal and an equal-delay branch point according to this embodiment.

Next description will be of a procedure of the process performed at Step S16 in FIG. 5 or at Step S18 in FIG. 6, that is, a process to connect the driver terminal and the equal-delay branch point, referring to FIG. 8.

To begin with, a path between layout hierarchies having the shortest distance and a minimum number of crossing over boundaries of layout hierarchies is selected between a driver terminal and an equal-delay branch point in designated layout hierarchy, as same as at Step S21 in FIG. 7 (Step S31).

The layout hierarchy connecting terminals are disposed on the boundaries of the layout hierarchies through which the path between layout hierarchies passes. At this time, the layout connecting terminal should be disposed by selecting optimum positions, considering superimposition of a layout hierarchy connecting terminal belonging to another signal system, obstacles in the vicinity, etc. (Step S32).

After that, a specified wire length is so allocated to each layout hierarchy that the path between the driver terminal and the equal-delay branch point has an equal delay and a predetermined wire length (Step S33). The allocation of the specified wire length is performed considering a routing area in each layout hierarchy, a degree of crowdedness of cells, and a degree of crowdedness of wires. On the basis of the specified wire length allocated at Step S33, the specified length routing of the clock signal line is performed in each of the layout hierarchies (Step S34).

The above procedure of the process shown in FIGS. 5 through 8 is an instance where placement of the layout hierarchies and placement of cells within the layout hierarchies are completed. Next description will be of a procedure for a clock routing design according to this embodiment in the case where placement of the layout hierarchies is completed but placement of the cell in a part of the layout hierarchies is not completed, by reference to a flowchart shown in FIG. 9.

Figure 9:
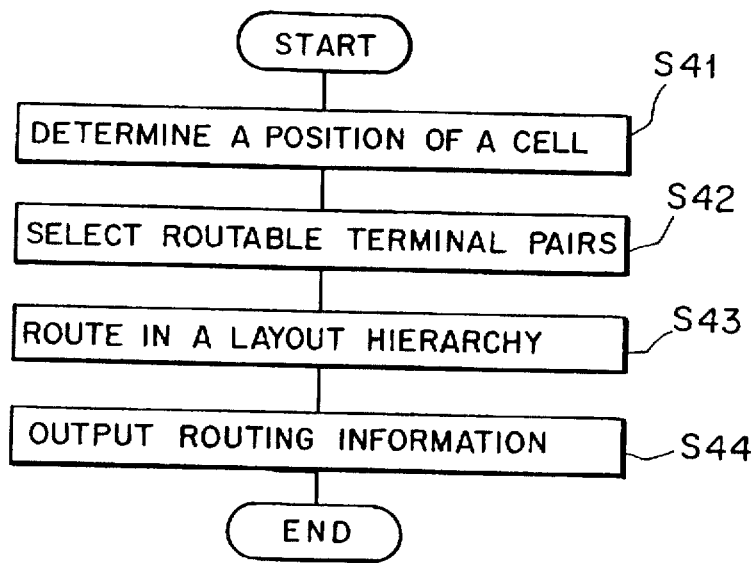
FIG. 9 is a flowchart illustrating a procedure of the clock routing design according to this embodiment if a cell in a part of layout hierarchies is not yet placed.

A method of the clock routing design shown in FIG. 9 also focuses on a certain clock signal system. According to the clock routing design method shown in FIG. 9, a clock signal line is so routed between the layout hierarchies as to yield equal delays of a clock signal supplied from one driver terminal to a plurality of receiver terminals in that clock signal system. The procedure of the process described by reference to FIG. 9 aims the first routing model shown in FIG. 3 or the second routing model shown in FIG. 4.

As shown in FIG. 9, if a cell including a driver terminal or a receiver terminal belonging to a clock signal system that is an object of the routing design is not yet placed in a predetermined layout hierarchy, a position of that cell is determined on an assumption that the cell is placed in the center of the predetermined layout hierarchy (Step S41). If a position of the cell has been already decided, the coordinates of that cell are used as they are.

After the position of the cell has been determined, routable pairs of the receiver terminals, driver terminals and equal-delay branch points are selected (Step S42). Among the pairs of the receiver terminals and the driver terminals, if a cell of either one the terminals of a pair is definitely disposed, that pair is selected as a routable pair. In terms of a pair of the equal-delay branch points, if both of the equal-delay branch points of a pair are definitely generated, that pair is selected as a routable terminal pair. Detailed description of routable terminal pairs will be made by reference to FIG. 27.

Each of the routable terminal pair selected at Step S42 is routed at the shortest length within a layout hierarchy in which placement of the cell is completed (Step S43). The routable terminal pairs selected at Step S42 and a result of the routing at Step S43 are outputted as routing information (for example, they are outputted on the graphic display 4 shown in FIG. 2, or outputted to be stored in the database 1) (Step S44). Using this routing result, unrouted portions is found in the next clock routing so as to be routed.

As having been described the outline of the procedures of the processes according to the clock routing design method of this invention by reference to FIGS. 5 through 9, more detailed description of the routing process will be next described by reference to FIGS. 10 through 27. In FIGS. 10 through 14 and 16 through 24, an area enclosed by a thick line "Layout 0" designates a chip level, areas enclosed by thin lines "Layout 1" through "Layout 5" designate layout hierarchies divided and set within the area "Layout 0" on the chip, as same as in FIGS. 28 through 31. Here are shown five layout hierarchies having been set. In FIGS. 20 through 24, areas enclosed by double lines "Layout 2" and "Layout 5" designate layout hierarchies in which internal cells are not yet placed.

In FIGS. 10 through 14 and 16 through 24, "●" designates a driver terminal DV1 providing a clock signal, "○" designates receiver terminals RV1 through RV4 receiving the clock signal from the driver terminal DV1, and "◎" designates clock supplying terminals M1 through M8 set on boundaries of the layout hierarchies "Layout 1" through "Layout 5". Further, "□" designates equal-delay branch points ED1 through ED3, and "*" designates equal-delay branch points ED1 through ED3 assumptively set.

Figure 10:
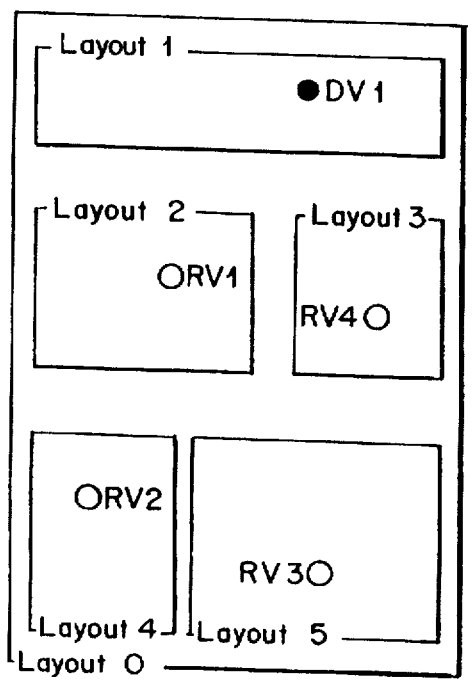
FIGS. 10 through 14 show a practical procedure of the clock routing design according to this embodiment.

To begin with, a practical procedure of the clock routing design for the first routing model shown in FIG. 3 will be now described by reference to FIGS. 10 through 15. In FIG. 10, there are shown LSI layout data besides how a clock signal system (the driver terminal DV1 and the receiver terminals RV1–RV4) included in the layout data branches and extends to the layout hierarchies. As shown in FIG. 10, a procedure of the routing design for the clock signal system branching and extending to each of the hierarchy will be described by reference to FIGS. 10 through 15.

Figures 15, 16:
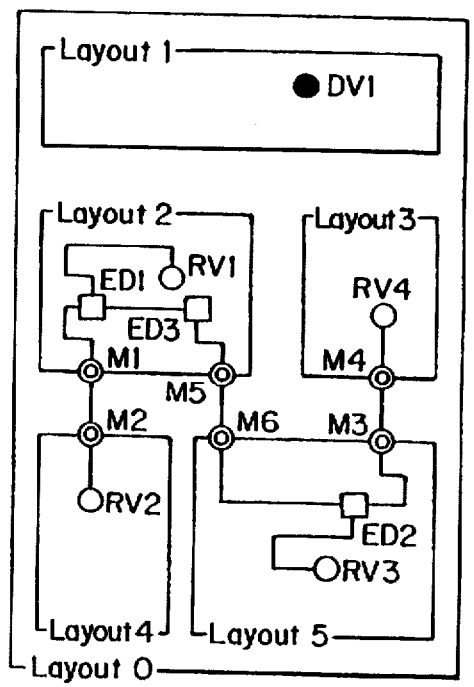
FIG. 15 is a table showing a relation between each terminal and a layout hierarchy to which each of the terminal belongs according to this embodiment.
FIGS. 16 through 24 show a practical procedure of the clock routing design according to this embodiment.

On the basis of the layout data about placement of the layout hierarchies and the layout data about the clock signal system, a table as shown in FIG. 15 to define a relation between each terminal and a layout hierarchy to which that terminal belongs is made to grasp which layout hierarchies the driver terminal DV1 and the receiver terminals RV1–RV4 of the clock signal system are included in, respectively. A table in FIG. shows an example where the driver terminal DV1 is disposed in the layout hierarchy "Layout 1" and the receiver terminals RV1–RV4 are disposed in the layout hierarchies "Layout 2", "Layout 4", "Layout 5" and "Layout 3", respectively, correspondingly to an example shown in FIG. 10.

Figure 11:
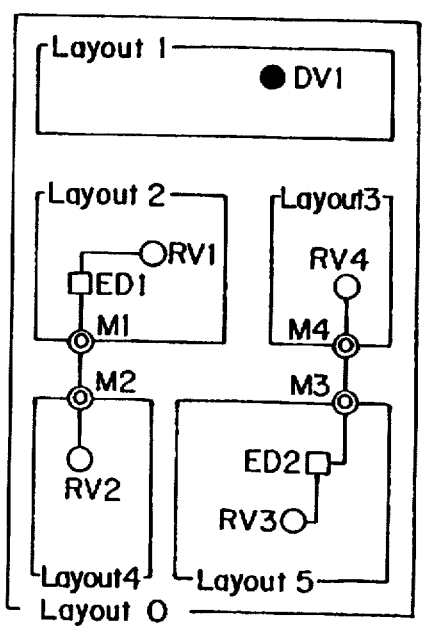

As shown in FIG. 11, the receiver terminals RV1 and RV2 are selected as a pair, and the receiver terminals RV3 and RV4 are selected as another pair (Step S11 in FIG. 5). Thereafter, a path between layout hierarchies extending from the receiver terminal RV1 to the receiver terminal RV2 is selected (Step S21 in FIG. 7). Layout hierarchy connecting terminals M1 and M2 are then selected (Step S22 in FIG. 7). Paths between RV1 and M1 in the layout hierarchy "Layout 2", RV2 and M2 in the layout hierarchy "Layout 4", and M1 and M2 in the layout hierarchy "Layout 0" are routed at the shortest lengths in the respective hierarchies (Step S23 in FIG. 7).

Similarly, a path between the layout hierarchies extending from the receiver terminal RV3 to the receiver terminal RV4 is selected (Step S21 in FIG. 7). The layout hierarchy connecting terminals M3 and M4 are then selected (Step S22 in FIG. 7). Paths between RV3 and M3 in the layout hierarchy "Layout 5", RV4 and M4 in the layout hierarchy "Layout 3", and M3 and M4 in the layout hierarchy "Layout 0" are routed at the shortest lengths in the respective layout hierarchies (Step S23 in FIG. 7).

After that, an equal-delay branch point ED1 between RV1 and RV2 is searched, and an equal-delay branch point ED2 between RV3 and RV4 are also searched (Step S24 in FIG. 7).

Figure 12:
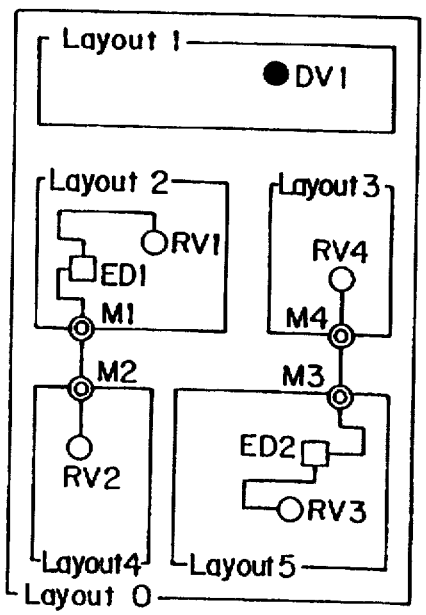

As shown in FIG. 12, the specified length routing is performed to route the paths between RV1 and ED1, and M1 and ED1 so that the paths between RV1 and ED1, and RV2 and ED1 have equal delays and a predetermined wire length. Similarly, the specified length routing is performed to route the paths between RV3 and ED2, and M3 and ED2 so that the paths between RV3 and ED2, and RV4 and ED2 have equal delays and a predetermined wire length (Step S25 in FIG. 7).

At the time of finish of the routing as shown in FIG. 12, it is decided at Step S14 in FIG. 5 that the number of pairs is one. The procedure proceeds to the process to connect the driver terminal and the equal-delay branch point as having been described by reference to FIG. 8.

Figure 13:
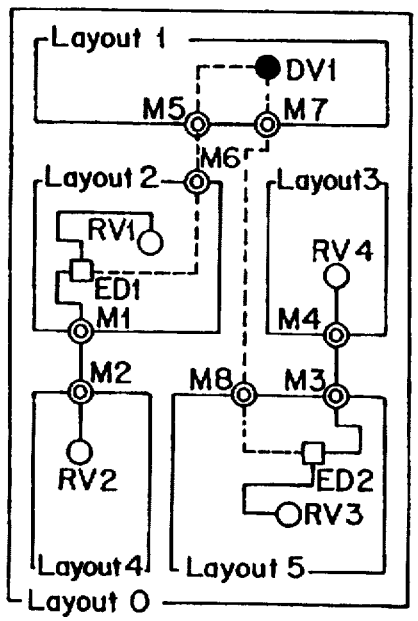

As shown in FIG. 13, a path between layout hierarchies extending from DV1 to ED1 is selected (Step S31 in FIG. 8). The layout hierarchy connecting terminals M5 and M6 are selected (Step S32 in FIG. 8). After that, specified wire lengths are allocated to paths between DV1 and M5 in the layout hierarchy "Layout 1", ED1 and M6 in the layout hierarchy "Layout 2", and M5 and M6 in the layout hierarchy "Layout 0", respectively, in the respective layout hierarchies (Step S33 in FIG. 8).

Similarly, a path between layout hierarchies extending from DV1 to ED2 is selected (Step S31 in FIG. 8). The layout hierarchy connecting terminals M7 and M8 are selected (Step S32 in FIG. 8). After that, specified wire lengths are allocated to paths between DV1 and M7 in the layout hierarchy "Layout 1", ED2 and M8 in the layout hierarchy "Layout 5", and M7 and M8 in the layout hierarchy "Layout 0", respectively, in the respective layout hierarchies (Step S33 in FIG. 8).

Figure 14:
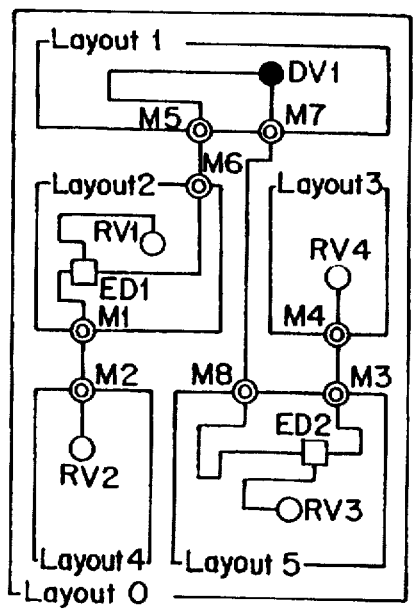

After that, paths between DV1 and M5 in the layout hierarchy "Layout 1", ED1 and M6 in the layout hierarchy "Layout 2", and M5 and M6 in the layout hierarchy "Layout 0" are routed at specified lengths, respectively, as shown in FIG. 14. Similarly, paths between DV1 and M7 in the layout hierarchy "Layout 1", ED2 and M8 in the layout hierarchy "Layout 5", and M7 and M8 in the layout hierarchy "Layout 0" are routed at specified lengths, respectively, in the respective hierarchies (Step S34 in FIG. 8).

As above, the routing design based on the layout hierarchy placement and the layout data of the clock signal system shown in FIG. 10, complying with the first routing model shown in FIG. 3, is completed.

Next, a practical procedure of the clock routing design for the second routing model shown in FIG. 4 will be described by reference to FIGS. 16 through 19. If a routing design complying with the second routing model shown in FIG. 4 is performed on the basis of the layout hierarchy placement and the layout data of the clock signal system as shown in FIG. 10, paths between RV1 and RV2, and RV3 and RV4 are routed at specified lengths, respectively, as shown in FIG. 12 in a manner similar to that shown in FIGS. 10 through 12. After that, a process which will be described later by reference to FIGS. 16 through 19 is performed.

As shown in FIG. 16, a path between layout hierarchies extending from ED1 to ED2 is first selected (Step S21 in FIG. 7), the layout hierarchy connecting terminals M5 and M6 are then selected (Step S22 in FIG. 7). Paths between ED1 and M5 in the layout hierarchy "Layout 2", ED2 and M6 in the layout hierarchy "Layout 5", and M5 and M6 in the layout hierarchy "Layout 0" are routed at the shortest lengths, respectively, in the respective layout hierarchies (Step S23 in FIG. 7). After that, an equal-delay branch point ED3 between ED1 and ED2 is searched (Step S24 in FIG. 7).

Figure 17:
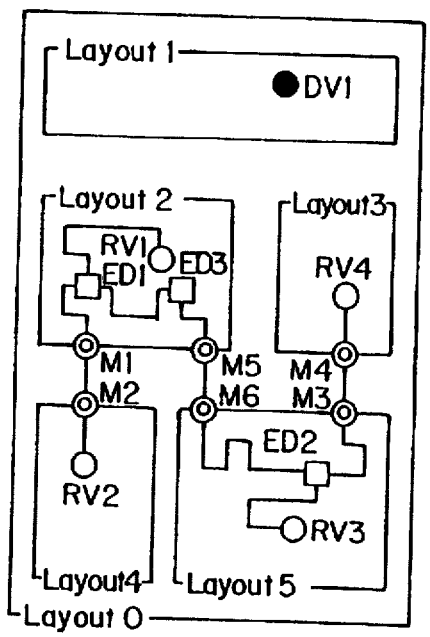

Next, as shown in FIG. 17, paths between ED1 and ED3, and ED2 and M6 are routed, respectively, in the specified length routing so that a path between ED1 and ED3 and a path between ED2 and ED3 have equal delays and a predetermined routing length (Step S25 in FIG. 7).

At the time of finish of the routing as shown in FIG. 17, it is decided at Step S17 in FIG. 6 that the number of the equal-delay branch points is one in the example shown in FIG. 17. The procedure then proceeds to the process at Step 18, that is, the process to connect the driver terminal to the equal-delay branch point, which has been described by reference to FIG. 8.

Figure 18:
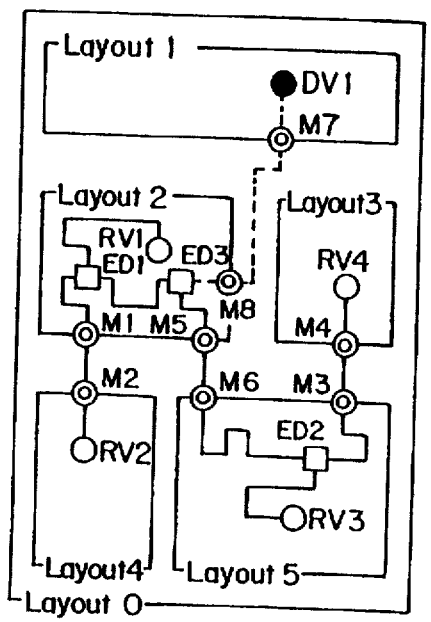

As shown in FIG. 18, a path between layout hierarchies extending from DV1 to ED3 is selected (Step S31 in FIG. 8). The layout hierarchy connecting terminals M7 and M8 are selected (Step S32 in FIG. 8). Specified wire lengths are allocated to the paths between DV1 and M7 in the layout hierarchy "Layout 1", ED3 and M8 in the layout hierarchy "Layout 2", and M7 and M8 in the layout hierarchy "Layout 0", respectively, in the respective layout hierarchies (Step S33 in FIG. 8).

Figure 19:
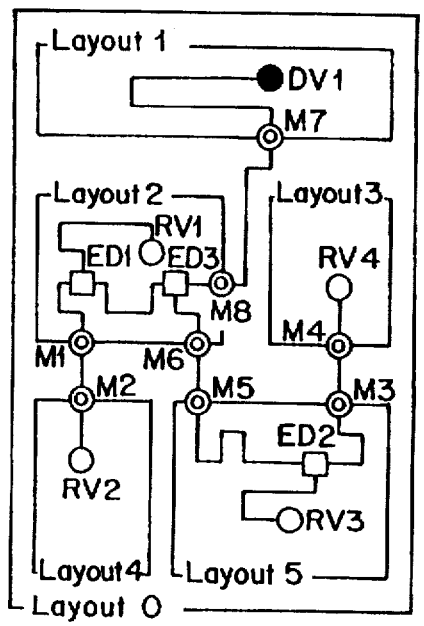

After that, as shown in FIG. 19, paths between DV1 and M7 in the layout hierarchy "Layout 1", ED3 and M8 in the layout hierarchy "Layout 2", and M7 and M8 in the layout hierarchy "Layout 0" are routed at specified lengths, respectively, in the respective layout hierarchies (Step S34 in FIG. 8).

As above, a routing design complying with the second routing model shown in FIG. 4 on the basis of the layout hierarchy placement shown in FIG. 10 and the layout data about the clock signal system is completed.

Figure 20:
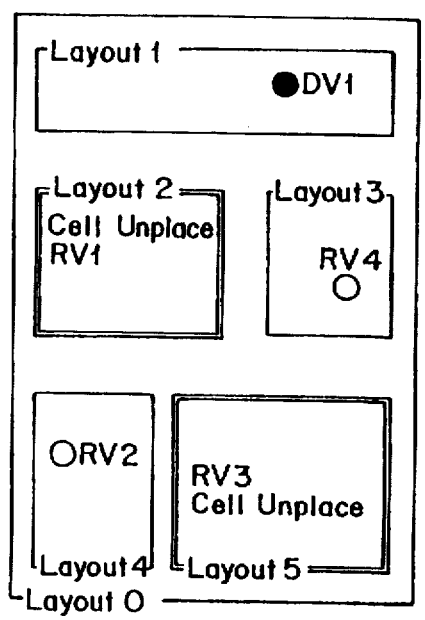

Next description will be of a practical procedure for the clock routing design according to this embodiment (refer to the flowchart shown in FIG. 9) in the case where cells in a part of the layout hierarchies are not yet placed by reference to FIGS. 20 through 27. Incidentally, assuming here that cells in the layout hierarchies "Layout 2" and "Layout 5" among the five layout hierarchies are not yet placed, as shown in FIG. 20.

Based on layout hierarchy placement shown in FIG. 20 and layout data about the clock signal system, a table as shown in FIG. 25 (which is quite the same as that shown in FIG. 15) is made to grasp which layout hierarchies the driver terminal and the receiver terminals RV1–RV4 in the clock signal system are included in, respectively.

As shown in FIG. 26, a table is made to define a relation between each layout hierarchy and a state of cell placement (placement completed/placement incompleted) so as to confirm whether the cell placement is completed in a layout hierarchy in which each of the terminals constituting the clock signal system is included. As seen from the table shown in FIG. 26, the layout hierarchies "Layout 2" and "Layout 5" are set to "unplaced" correspondingly to the example shown in FIG. 20.

Figure 21:
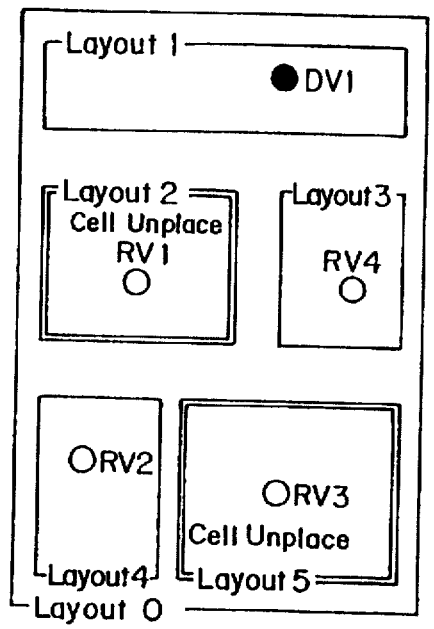

The receiver terminals RV1 and RV3 belong to the layout hierarchies "Layout 2" and "Layout 5", respectively, but the cell placement within these layout hierarchies "Layout 2" and "Layout 5" is not yet completed, in this example. For this, assuming in this embodiment that the cells having the receiver terminals RV1 and RV3 each is placed in the center of the corresponding layout hierarchy "Layout 2" or "Layout 5", as shown in FIG. 21 (Step S41 in FIG. 9).

Figure 22:
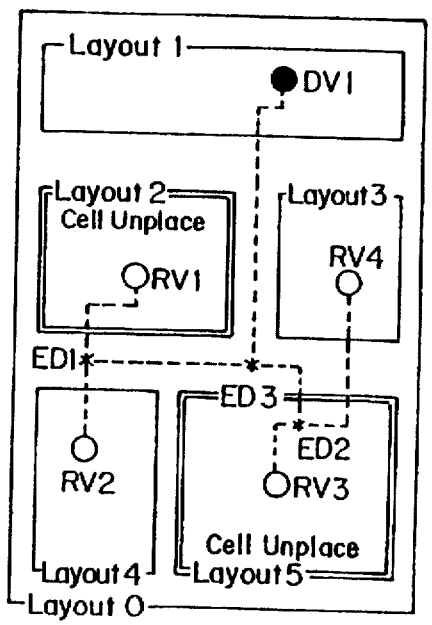

Under a condition where the positions of the receiver terminal RV1 and RV3 are assumptively determined on the assumption of the positions of the cells as above, pairs of the terminals used to design the routing of the clock signal system in the second routing model shown in FIG. 4 are determined as shown in FIG. 22 in, for example, a manner as having been described by reference to FIGS. 6 through 8. In an example shown in FIG. 22, RV1 and RV2, RV3 and RV4, ED1 and ED2, and DV1 and ED3 are assumed to be pairs. Incidentally, ED1 designates an assumptive equal-delay branch point between RV1 and RV2, ED2 designates an assumptive equal-delay branch point between RV3 and RV4, and ED3 designates an assumptive equal-delay branch point between ED1 and ED2.

Routable terminal pairs among the assumptive pairs are selected (Step S42 in FIG. 9). In an example shown in FIG. 23, a pair of RV1 and RV2 and a pair of RV3 and RV4 are selected.

Reasons why the pair of RV1 and RV2 and the pair of RV3 and RV4 are selected here, and why a pair of ED1 and ED2 and a pair of DV1 and ED3 are not selected are tabulated as shown in FIG. 27.

A reason why the pair of RV1 and RV2 is selected is that placement of the cell including RV2 of the receiver terminal pair is determined in the layout hierarchy "Layout 4". A reason why the pair of RV3 and RV4 is selected is that placement of the cell including RV4 of the receiver terminal pair is determined in the layout hierarchy "Layout 3". To the contrary, why the pair of ED1 and ED2 is not selected is that connections between RV1 and RV2, and RV3 and RV4 are incomplete. Why the pair of DV1 and ED3 is not selected is that a connection between ED1 and ED2 is incomplete.

Figure 23:
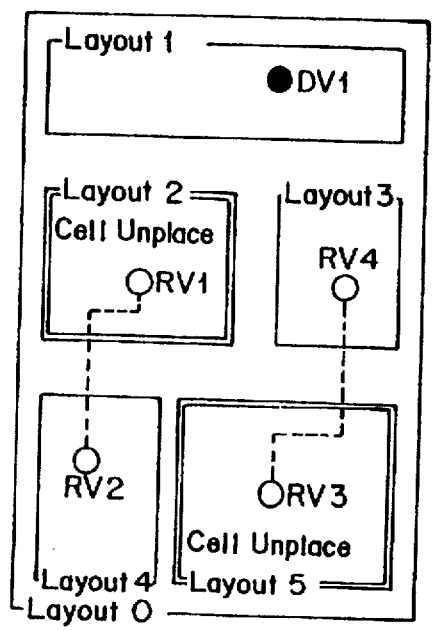
Figure 24:
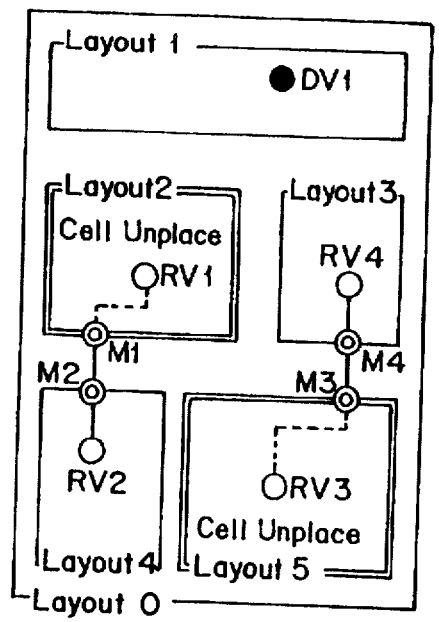
Figure 28:
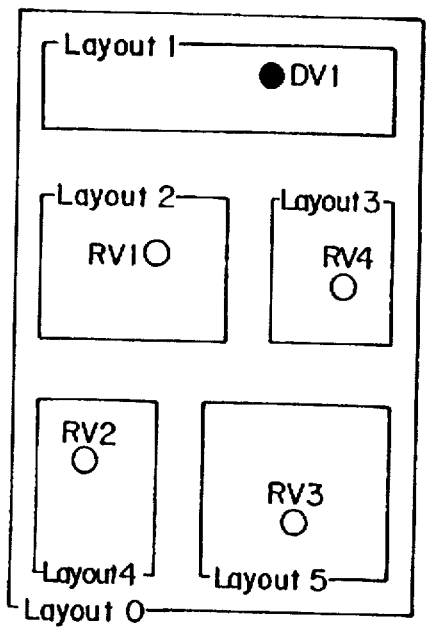
FIGS. 28 through 31 show a procedure of a general clock signal line routing design performed using a hierarchy layout design.
Figure 29:
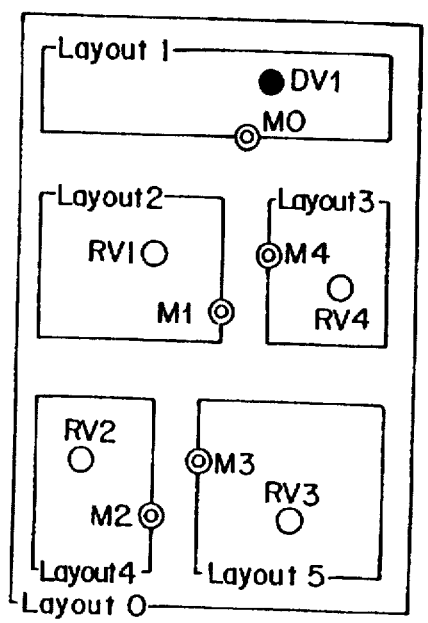
Figure 30:
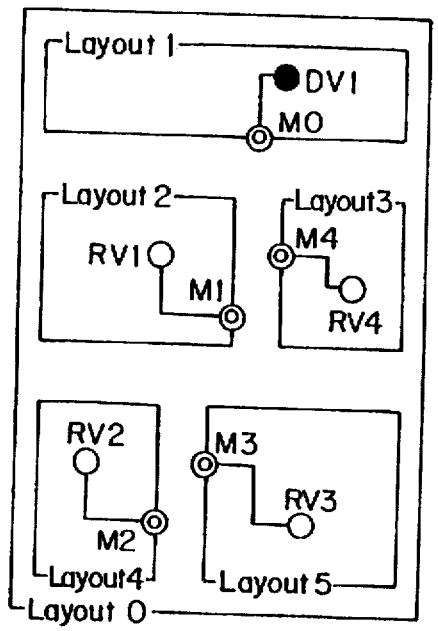
Figure 31:
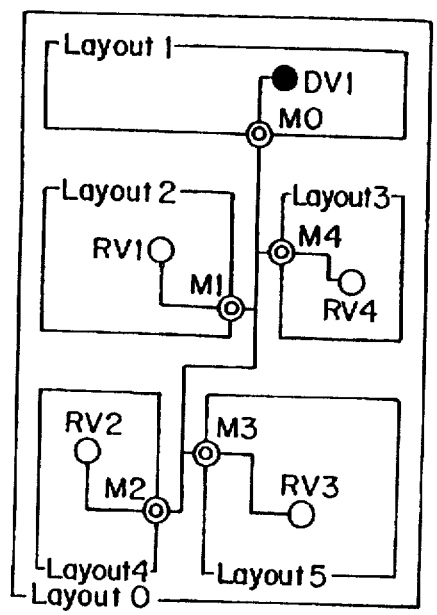

The pairs of RV1 and RV2, and RV3 and RV4 having been selected as shown in FIG. 23 are then routed, respectively, in the respective layout hierarchies as shown in FIG. 24 (Step S44 in FIG. 9). More specifically, a path between layout hierarchies extending from RV1 to RV2 is selected, layout hierarchy connecting terminals M1 and M2 are selected, and paths between RV2 and M2 in the layout hierarchy "Layout 4", and M1 and M2 in the layout hierarchy "Layout 0" are routed, at the shortest lengths, respectively, in the respective layout hierarchies. The routing between RV1 and M1 is not performed since placement of the cell in the layout hierarchy "Layout 2" is not completed.

Similarly, a path between layout hierarchies extending from RV3 to RV4 is selected, layout hierarchy connecting terminals M3 and M4 are selected, and paths between RV4 and M4 in the layout hierarchy "Layout 3", and M3 and M4 in the layout hierarchy "Layout 0" are routed at the shortest lengths, respectively, in the respective layout hierarchies. Likewise, the routing between RV3 and M3 is not performed since placement of the cell in the layout hierarchy "Layout 5" is incompleted.

In the case of a layout hierarchy including a cell having not yet placed as shown in FIG. 20, the clock routing is finished in a state of the routing design as shown in FIG. 24, and a result of the routing as shown in FIG. 24 is outputted as routing information and displayed on the graphic display 4 shown in FIG. 2 or stored as a text file in the data base 1, for example. As stated hereinbefore, using this result of the routing, it is possible to find out the remaining unrouted part and route it when the next clock routing is executed.

According to the embodiment of this invention, it is possible to route the clock signal system branching and extending to a plurality of the layout hierarchies "Layout 1" through "Layout 5" so as to yield equal delays. It is also possible to work out a routing design for each layout hierarchy while paying an attention to each of the layout hierarchies "Layout 1" through "Layout 5" and considering the chip level "Layout 0". Application of this method to all over the clock signal system may provide a minimum clock skew and realize a reduce in time period required for the routing design.

If a driver terminal or a receiver terminal having not yet been placed is included in a layout hierarchy, it is possible to perform the routing process on the clock signal lines in layout hierarchies in which placement of cell has been decided even if placement of cells has not been decided in all the layout hierarchies so that the clock routing may be performed very effectively.

As having been described in detail in the above embodiment an example where the model includes five layout hierarchies, one driver terminal and four receiver terminals, this invention is not limited to the above numbers of the elements.

The clock routing method of this invention is applicable to a routing design of a clock signal system for not only LSIs but also printed circuits. In which case, this invention may provide the same advantages as in the above embodiment.

What is claimed is:

1. A clock routing design method for making a routing design of clock signal lines between a driver terminal supplying a clock signal and a plurality of receiver terminals receiving the clock signal from the driver terminal using a hierarchical layout design in which an area that is an object of the routing design is divided into a plurality of layout hierarchies and each of said layout hierarchies has a physical region boundary on which a clock supplying terminal is placed, the clock routing design method comprising the steps of:

(a) routing the clock signal line including a clock signal line part connecting the clock supplying terminals to each other between said plural receiver terminals separately positioned on said respective plural layout hierarchies over said plural layout hierarchies while considering an equal-delay branch point yielding equal delays of the clock signal at said receiver terminals; and (b) routing the clock signal line between the equal-delay branch point positioned between said plural receiver terminals and said driver terminal.

2. A clock routing design method using a hierarchical layout design according to claim 1, wherein step (a) includes:

(a1) dividing said plural receiver terminals into pairs in a receiver terminal pair forming process, (a2) routing the clock signal line between said receiver terminals of a pair in a receiver terminal interconnecting process, and (a3) searching for the equal-delay branch point yielding equal delays of the clock signal at the receiver terminals of said pair on the clock signal line between said pair of the receiver terminals in an equal-delay branch point searching process; and wherein said steps (a2) and (a3) are performed on each pair of the receiver terminals formed in said receiver terminal pair forming process.

3. A clock routing design method using a hierarchical layout design according to claim 2, wherein if the number of the equal-delay branch points searched in said equal-delay branch point searching process is plural step (a) includes:

(a4) dividing said plural equal-delay branch points searched in said equal-delay branch point searching process into pairs in an equal-delay branch point pair forming process, (a5) routing the clock signal line between the equal-delay branch points of a pair in an equal-delay branch point interconnecting process, and (a6) re-searching an equal-delay branch point yielding equal delays at the equal delay branch points of said pair on the clock signal line between said pair of the equal-delay branch points in an equal-delay branch point re-searching;

wherein steps (a4) and (a5) are performed on each pair of said equal-delay branch points formed in said equal-delay branch point pair forming process; and wherein said equal-delay branch point pair forming process, said equal-delay branch point interconnecting process and said equal-delay branch point re-searching process are repeat until the number of said equal-delay branch points becomes at least one.

4. A clock routing design method using a hierarchical layout design according to claim 2, wherein step (a2) includes:

(a2a) selecting a path between layout hierarchies having the shortest length and a minimum number of crossings over boundaries of layout hierarchies between each pair of said receiver terminals, (a2b) disposing a layout hierarchy connecting terminals at appropriate positions on the boundaries of the layout hierarchies, through which said path between layout hierarchies passes, and (a2c) routing a clock signal line passing through said layout hierarchy connecting terminals and connecting said pair of the receiver terminals at the shortest length; and wherein step (a3) includes:

(a3a) searching for an equal-delay branch point on the clock signal line between said pair of the receiver terminals obtained in said shortest length routing.

5. A clock routing design method using a hierarchical layout design according to claim 4, wherein step (a3a) includes routing the clock signal line between said pair of the receiver terminals at a specified wire length within a layout hierarchy including the equal-delay branch point searched in said step (a3a) while keeping a position of said equal-delay branch point.

6. A clock routing design method using a hierarchical layout design according to claim 5, wherein if said specified length routing in said step (a3a) is impossible within the layout hierarchy including said equal-delay branch point, the clock signal line in another layout hierarchy becomes an object of the specified length routing.

7. A clock routing design method using a hierarchical layout design according to claim 3, wherein step (a5) includes:

(a5a) selecting a path between layout hierarchies having the shortest length and a minimum number of crossings over boundaries of layout hierarchies between each pair of the equal-delay branch points, (a5b) posing layout hierarchy connecting terminals at appropriate positions on the boundaries of the layout hierarchies through which said path between layout hierarchies passes, and (a5c) routing a clock signal line passing through said layout hierarchy connecting terminals and connecting said pair of the equal-delay branch points at the shortest length; and wherein step (a6) includes (a6a) searching an equal-delay branch point on said clock signal line between said pair of the equal-delay branch points obtained in said shortest length routing.

8. A clock routing design method using a hierarchical layout design according to claim 7, wherein step (a6a) includes:

(a6a1) routing the clock signal line between said pair of the equal-delay branch points at a specified wire length within a layout hierarchy including said equal-delay branch point searched in said equal-delay branching point researching process while keeping a position of said equal-delay branching point.

9. A clock routing design method using a hierarchical layout design according to claim 8, wherein if said specified wire length routing is impossible within the layout hierarchy including said equal-delay branching point in step (a6a1), the clock signal line in another layout hierarchy becomes an object of said specified length routing.

10. A clock routing design method using a hierarchical layout design according to claim 2,
wherein if the number of pairs of the equal-delay branch points which have not been routed to said each other becomes one, step (a) includes:
selecting paths between layout hierarchies each having the shortest length and a minimum number of crossings over boundaries of layout hierarchies between said driver terminal and each of the equal-delay branch points of said pair, and
disposing layout hierarchy connecting terminals at appropriate positions on the boundaries of the layout hierarchies through which said paths between layout hierarchies pass; and
wherein step (b) includes:
allocating a specified wire length to each of the clock signal lines passing through said layout hierarchy connecting terminals,
connecting said driver terminal and each of the equal-delay branch points of said pairs so as to yield equal delays of the clock signal supplied from said driver terminal to said equal-delay branch points at said equal-delay branch points of said pair and to provide a determined wire length, and
routing each of the clock signal lines at a specified wire length in each layout hierarchy on the basis of the specified length allocated.

11. A clock routing design method using a hierarchical layout design according to claim 3,
wherein if the number of pairs of the equal-delay branch points which have not been routed to each other becomes one, said step (a) includes:
selecting paths between layout hierarchies each having the shortest length and a minimum number of crossings over boundaries of layout hierarchies between said driver terminal and each of the equal-delay branch points of said pair, and
disposing layout hierarchy connecting terminals at appropriate positions on the boundaries of the layout hierarchies through which said paths between layout hierarchies pass;
wherein said step (b) includes:
allocating a specified wire length to each of the clock signal lines passing through said layout hierarchy, connecting terminals and connecting said driver terminal and each of the equal-delay branch points of said pairs so as to yield equal delays of the clock signal supplied from said driver terminal to said equal-delay branch points at said equal-delay branch points of said pair and to provide a predetermined wire length, and
routing each of the clock signal lines at a specified wire length in each layout hierarchy on the basis of the specified length allocated.

12. A clock routing design method using a hierarchical layout design according to claim 2,
wherein if the number of the equal-delay branch points becomes one, said step (a) includes:
selecting a path between layout hierarchies having the shortest length and a minimum number of crossings over boundaries of layout hierarchies between said driver terminal and said equal-delay branch point, and
disposing layout hierarchy connecting terminals at appropriate positions on the boundaries of the layout hierarchies through which said path between layout hierarchies passes; and
wherein said step (b) includes:
allocating a specified wire length to a clock signal line passing through said layout hierarchy connecting terminals,
connecting said driver terminal and said equal-delay branch point in each layout hierarchy so that the clock signal line has a predetermined wire length, and
routing said clock signal line at a specified wire length in each of the layout hierarchy on the basis of the specified wire length allocated.

13. A clock routing design method using a hierarchical layout design according to claim 3,
wherein if the number of the equal-delay branch points becomes one, step (a) includes:
selecting a path between layout hierarchies having the shortest length and a minimum number of crossings over boundaries of layout hierarchies between said driver terminal and said equal-delay branch point, and
disposing layout hierarchy connecting terminals on appropriate positions on the boundaries of the layout hierarchies through which said path between layout hierarchies passes; and
wherein step (b) includes:
allocating a specified wire length to a clock signal line passing through said layout hierarchy connecting terminals,
connecting said driver terminal and said equal-delay branch point in each layout hierarchy so that the clock signal line has a predetermined wire length, and
routing said clock signal line at a specified wire length in each of the layout hierarchy on the basis of the specified wire length allocated.

14. A clock routing design method using a hierarchical layout design according to claim 1,
wherein if there is a terminal among the driver terminal and the receiver terminals belonging to said area that is an object of said routing design whose cell has not been placed within a predetermined layout hierarchy, said cell is assumed to be placed in the center of a layout hierarchy, and then said steps (a) and (b) are executed.

* * * * *

UNITED STATES PATENT AND TRADEMARK OFFICE
CERTIFICATE OF CORRECTION

PATENT NO. : 5,889,682
DATED      : March 30, 1999
INVENTOR(S): Masayuki OMURA, et al.

It is certified that error appears in the above-identified patent and that said Letters Patent is hereby corrected as shown below:

On the title page:

item [54] IN THE TITLE
Please change "HIERAICHICAL" to --HIERARCHICAL--.

item [73] ASSIGNEE:

Please add the following Assignee which was omitted:

--PFU LIMITED, Kahoku-gun, Ishikawa, Japan--.

Column 1, line 2, "Hieraichical" to -- Hierarchical--.

Signed and Sealed this

Twenty-third Day of November, 1999

Attest:

Q. TODD DICKINSON

*Attesting Officer*   *Acting Commissioner of Patents and Trademarks*